United States Patent
Gallegos (10) Patent No.: US 11,244,881 B2
(45) Date of Patent: Feb. 8, 2022

(54) PACKAGE TERMINAL CAVITIES

(71) Applicant: TEXAS INSTRUMENTS INCORPORATED, Dallas, TX (US)

(72) Inventor: Bernardo Gallegos, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/588,544

(22) Filed: Sep. 30, 2019

(65) Prior Publication Data
US 2021/0098322 A1 Apr. 1, 2021

(51) Int. Cl.
  H01L 23/31 (2006.01)
  H01L 21/56 (2006.01)
  H01L 21/48 (2006.01)
  H01L 23/495 (2006.01)

(52) U.S. Cl.
  CPC ........ *H01L 23/315* (2013.01); *H01L 21/4828* (2013.01); *H01L 21/565* (2013.01); *H01L 23/49517* (2013.01); *H01L 23/49534* (2013.01); *H01L 23/49582* (2013.01)

(58) Field of Classification Search
  CPC ............. H01L 23/315; H01L 23/49534; H01L 23/49582; H01L 23/49517; H01L 21/565; H01L 21/4828; H01L 21/56; H01L 21/48; H01L 34/31; H01L 23/495
  USPC ....................................................... 257/787
  See application file for complete search history.

(56) References Cited

U.S. PATENT DOCUMENTS

| | | | | |
|---|---|---|---|---|
| 4,400,762 A | * | 8/1983 | Bartley | ................. H01L 25/165 257/E25.031 |
| 6,263,565 B1 | * | 7/2001 | Gotoh | .................... H05K 3/403 174/262 |
| 2003/0001244 A1 | * | 1/2003 | Araki | ...................... H01L 24/32 257/666 |
| 2003/0006055 A1 | * | 1/2003 | Chien-Hung | ..... H01L 23/49548 174/534 |
| 2003/0015775 A1 | * | 1/2003 | Minamio | .......... H01L 23/49548 257/676 |
| 2007/0052070 A1 | * | 3/2007 | Islam | ................ H01L 23/49503 257/666 |
| 2011/0244629 A1 | * | 10/2011 | Gong | .................. H01L 21/4828 438/112 |
| 2012/0018860 A1 | * | 1/2012 | Maniwa | ................ H01L 21/486 257/666 |
| 2013/0069214 A1 | * | 3/2013 | Morioka | ........... H01L 23/49503 257/676 |
| 2016/0254214 A1 | * | 9/2016 | Makino | .................... H01L 24/32 257/676 |
| 2017/0271249 A1 | * | 9/2017 | Kasuya | ............. H01L 23/49866 |
| 2019/0287890 A1 | * | 9/2019 | Harada | .............. H01L 23/3107 |
| 2019/0341338 A1 | * | 11/2019 | Huang | .............. H01L 23/49503 |
| 2019/0385938 A1 | * | 12/2019 | Shi | .......................... H01L 21/78 |

* cited by examiner

*Primary Examiner* — Alexander O Williams
(74) *Attorney, Agent, or Firm* — Dawn Jos; Charles A. Brill; Frank D. Cimino (57) ABSTRACT

A package comprises a molding and a conductive terminal in contact with the molding and having a first surface exposed to a first surface of the molding. The conductive terminal includes a cavity having a first portion extending along at least half of the first surface of the conductive terminal and a second portion extending along less than half of the first surface of the conductive terminal.

18 Claims, 7 Drawing Sheets

PACKAGE TERMINAL CAVITIES

SUMMARY

In some examples, a package comprises a molding and a conductive terminal in contact with the molding and having a first surface exposed to a first surface of the molding. The conductive terminal includes a cavity having a first portion extending along at least half of the first surface of the conductive terminal and a second portion extending along less than half of the first surface of the conductive terminal.

In some examples, a method comprises providing a layer of conductive material; positioning a photoresist on the layer of conductive material; positioning a mask over the photoresist; and exposing the photoresist via the mask and developing the photoresist to produce a pattern on the photoresist. The method also comprises etching the layer of conductive material using the pattern to produce a cavity having a first portion extending along at least half of a first surface of the layer of conductive material and a second portion extending along less than half of the first surface of the layer of conductive material, the first and second portions in fluid communication with each other. The method further comprises producing a chip package using the layer of conductive material, the first surface of the layer of conductive material exposed to a first surface of the chip package.

BRIEF DESCRIPTION OF THE DRAWINGS

For a detailed description of various examples, reference will now be made to the accompanying drawings in which.

DETAILED DESCRIPTION

Electrical circuits are formed on semiconductor dies and subsequently packaged inside moldings (e.g., epoxy) to protect the circuits from damage due to elements external to the package, such as moisture, heat, and blunt force. To facilitate communication with electronics external to the package, an electrical circuit within the package is electrically coupled to conductive terminals. These conductive terminals are positioned inside the package but are exposed to one or more external surfaces of the package. By coupling the conductive terminals to electronics external to the package, a pathway is formed to exchange electrical signals between the electrical circuit within the package and the electronics external to the package via the conductive terminals.

Such packages are often mounted on printed circuit boards (PCBs), for example in a smartphone, personal computer, or other electronic device. To mount a package onto a PCB, a conductive material, such as solder, is positioned appropriately between the conductive terminals of the package and the electrical contacts on the PCB to which the conductive terminals should couple. The conductive material is then melted and subsequently allowed to solidify (a process generally referred to as "reflow"), thereby forming electrical pathways between the circuit within the package and one or more other electronic devices mounted on the PCB. Such packages, and more specifically, the packages' conductive terminals, are thus said to be "wettable." For example, such a conductive terminal may be referred to as being "solder wettable."

It is desirable to establish stable connections between the conductive terminals of a package and the corresponding electrical contacts on the PCB, because weak connections are prone to breaking, thereby terminating the possibility of electrical communication. One technique used to establish such stable connections entails the creation of a single cavity on the bottom surface of a conductive terminal, on the side surface of a conductive terminal, and on the corner of the conductive terminal between the bottom and side surfaces. When a reflow process is performed, the conductive material (e.g., solder) establishes the aforementioned connection between the conductive terminal and the PCB, and while doing so, a portion of the conductive material flows into this cavity via the bottom surface, through the cavity, and out of the portion of the cavity that is located on the side surface of the conductive terminal. The portion of the conductive material that flows out of the side surface of the conductive terminal is called a "fillet." If the amount of conductive material used during the reflow process is sufficient to establish a stable connection, the fillet will have a sharply sloped surface, with the highest point of the fillet slope being at the side surface of the conductive terminal, and the lowest point of the fillet slope being at the surface of the PCB. On the other hand, if the amount of conductive material used is insufficient to form a stable connection, or if the reflow process has been compromised in some other manner, the fillet will not have an adequate slope, but will instead be comparatively flat. Appropriate instrumentation, such as auto optical inspection (AOI) tools, may be used to determine fillet slope. Inspection of fillet slope is generally useful in determining whether stable connections have been formed.

The cavities in the conductive terminals are formed using a photolithography and etching process during leadframe manufacture. The shape of the cavity is generally a quadrant-sphere, such that the cavity appears to be roughly semi-circular on each of the bottom and side surfaces of the conductive terminal. The etching of such cavities into conductive terminals is generally successful when the conductive terminal length is less than or equal to a particular threshold. However, when the length of the conductive terminal exceeds this threshold, the etching process is generally unsuccessful, because the etchant etches too deeply into the conductive terminal, often etching all the way through the terminal. This problem is not satisfactorily rectified by reducing the surface area of the conductive terminal that is exposed for etching, because doing so reduces the reliability of the AOI fillet slope inspection described above. Generally, for reliable AOI fillet slope inspection, the length of the conductive terminal surface exposed for etching—and thus, the length of the cavity—should be at least half of the length of the conductive terminal.

This disclosure describes various examples of a novel conductive terminal and of methods for manufacturing the novel conductive terminal. During leadframe manufacture, the novel conductive terminal is etched to form a cavity in the terminal that overcomes the challenges described above. Specifically, the cavity has a first portion extending along at least half of a bottom surface of the conductive terminal and a second portion extending along less than half of the bottom surface of the conductive terminal. Further, the cavity extends along at least half of a side surface of the conductive terminal. Such a conductive terminal carries multiple technical advantages. For example, the formation of a cavity of this general shape mitigates the risk of the over-etching challenge described above, because the reduced size of the second portion relative to the first portion reduces the amount of etchant used to form the cavity. This ability to control etch rate presents a significant technical advantage because it confers the advantages (e.g., compliance with customer specifications) of a wide cavity area that extends along at least half of a surface of a conductive terminal while preventing the disadvantages (e.g., etch-through) traditionally associated with such wide cavity areas. Moreover, the general shape of the cavity promotes proper AOI fillet slope testing because the length of the first portion along the bottom surface (and the length of the cavity along the side surface) is at least 50% of the length of the conductive terminal.

Figure 1:
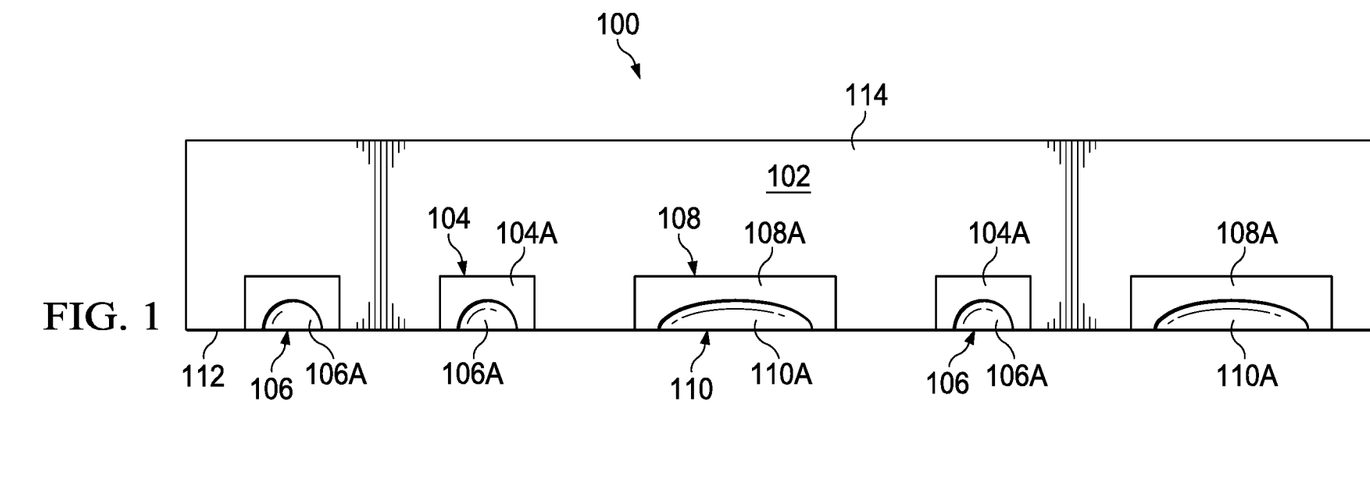
FIG. 1 depicts a side view of a package having conductive terminals in accordance with various examples.
Figure 2:
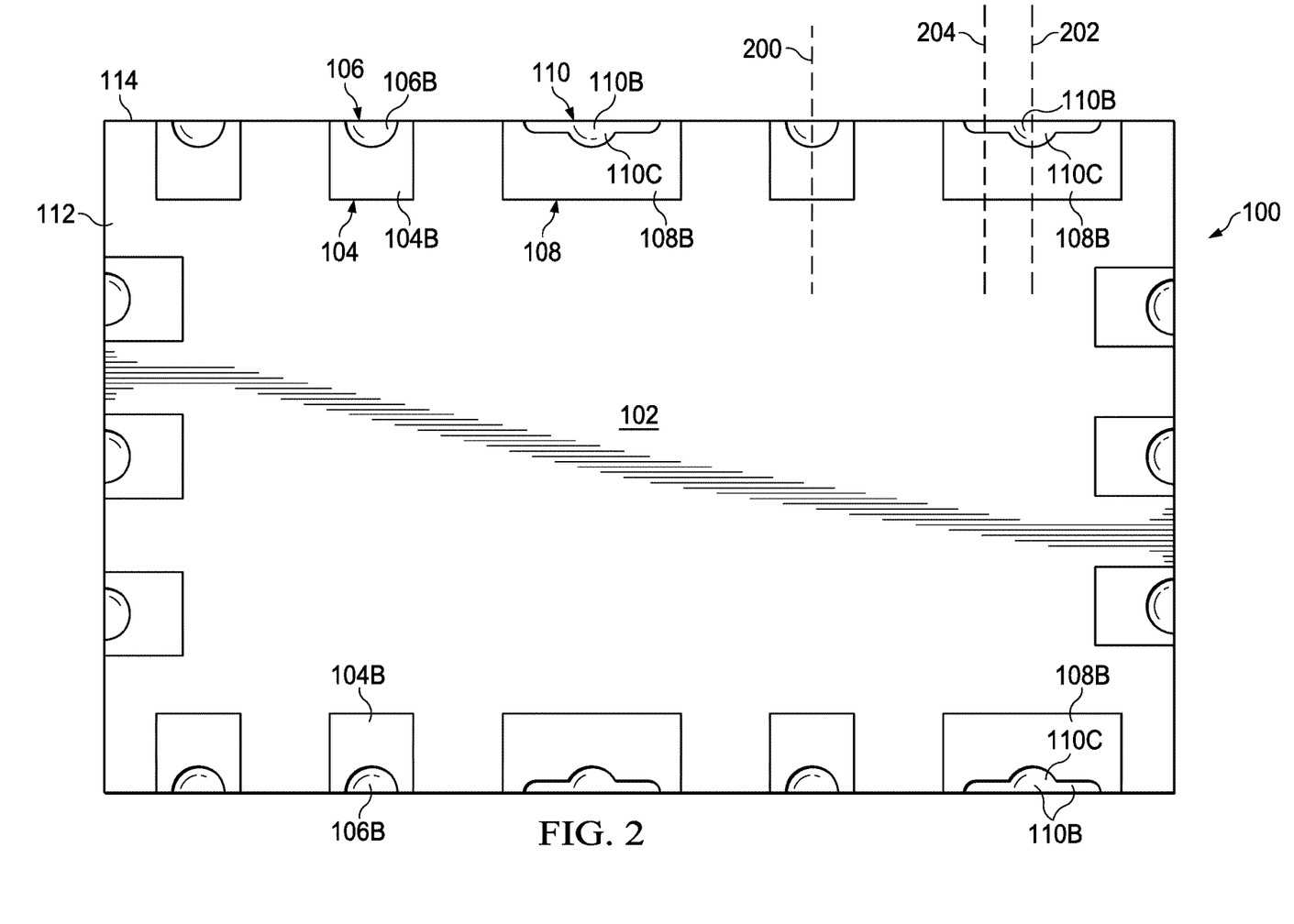
FIG. 2 depicts a bottom-up view of a package having conductive terminals in accordance with various examples.
Figure 3:
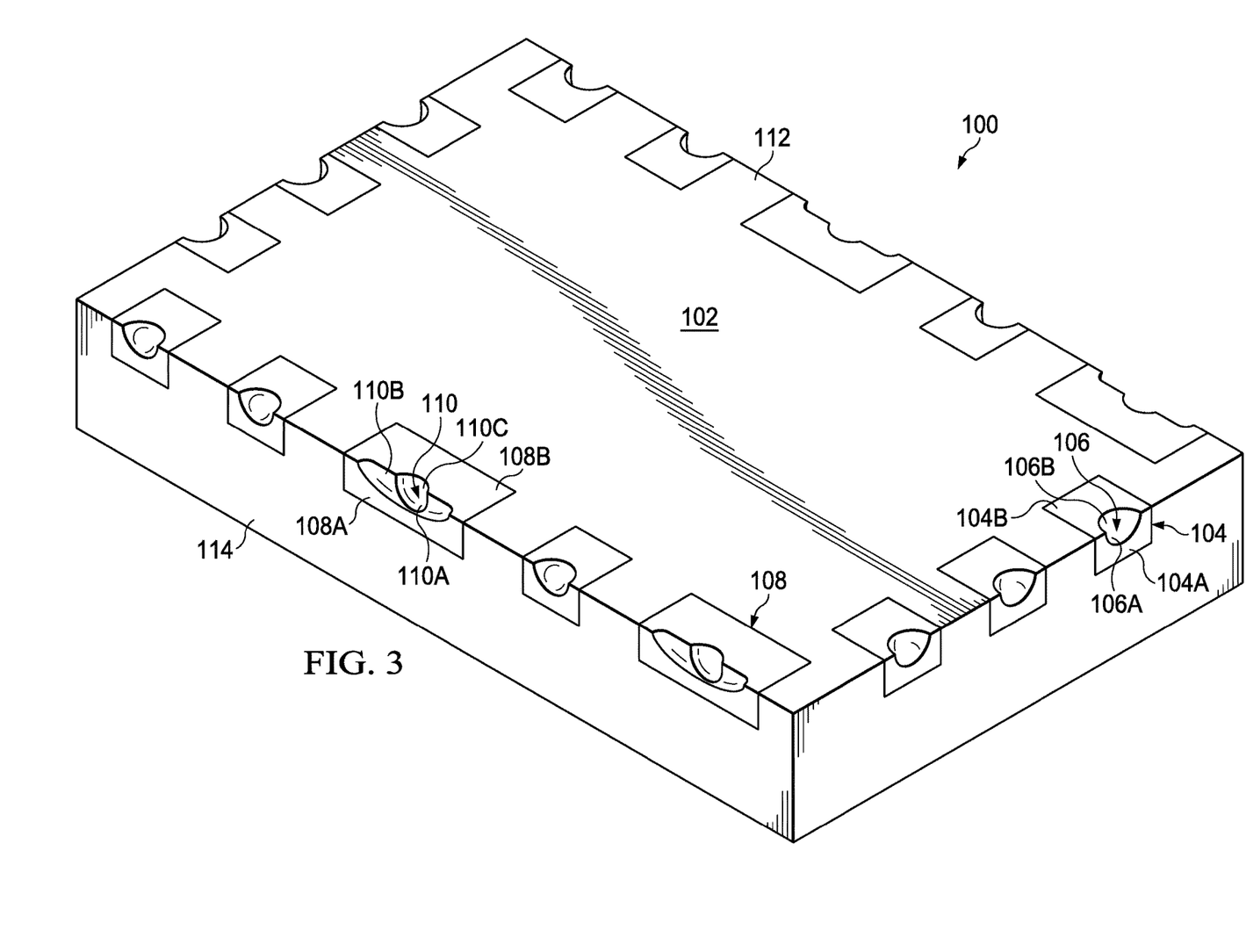
FIG. 3 depicts a perspective view of a package having conductive terminals in accordance with various examples.
Figure 4A:
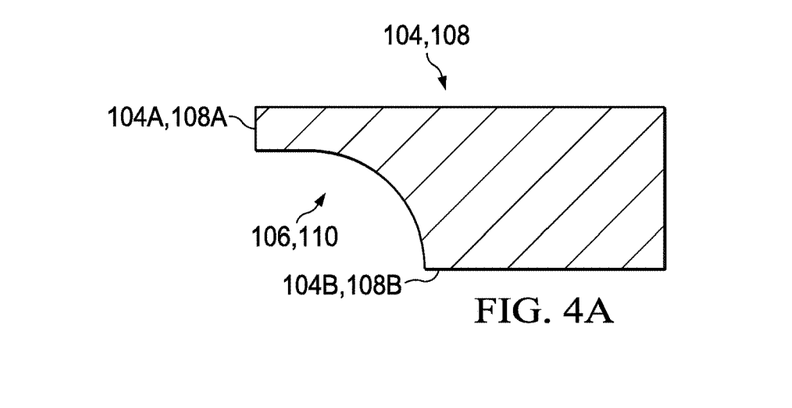
FIGS. 4A and 4B depict cross-sectional views of conductive terminals in accordance with various examples.
Figure 4B:
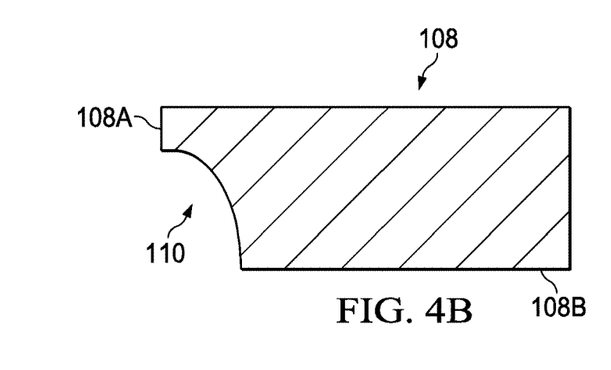
Figure 5:
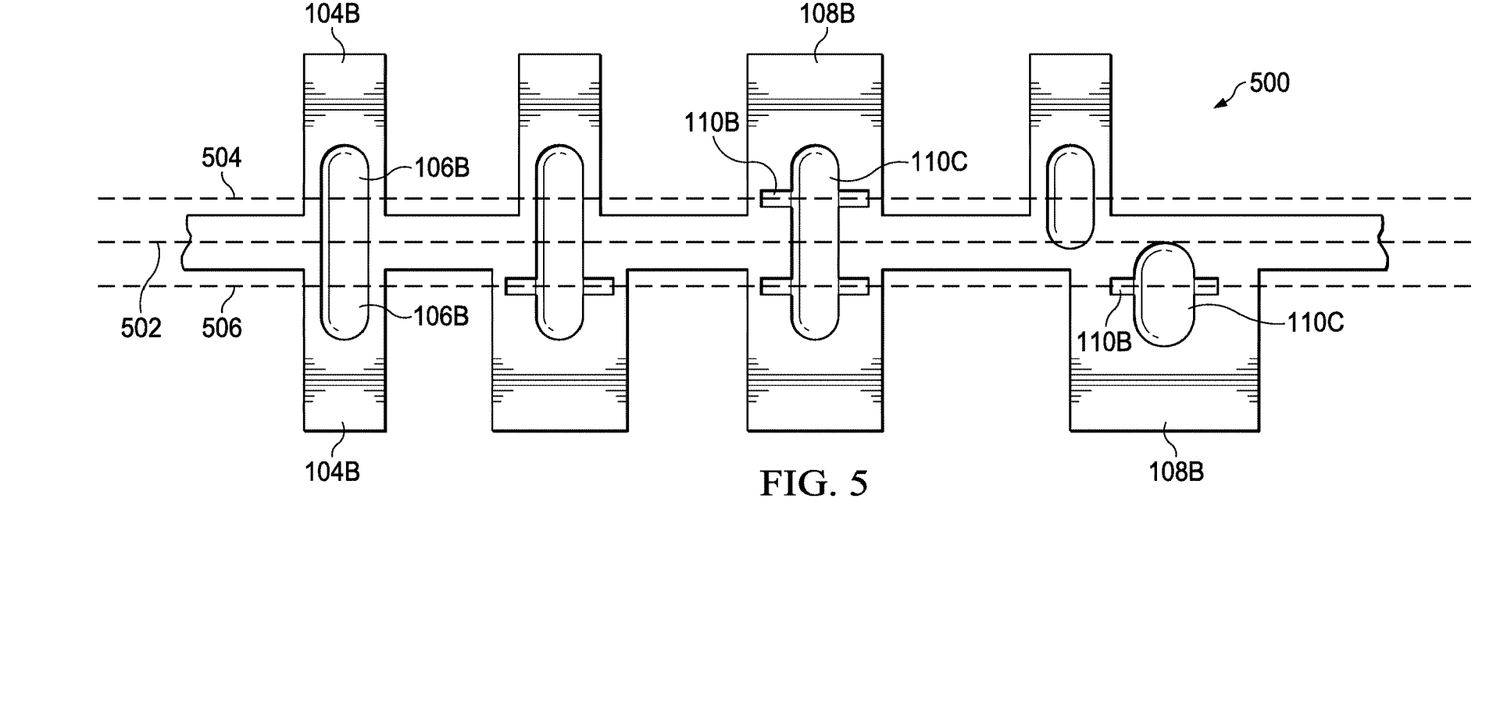
FIG. 5 depicts a bottom-up view of a portion of a leadframe strip including conductive terminals, in accordance with various examples.

FIGS. 1-3 provide various views of a package comprising multiple conductive terminals, at least some of which are the novel conductive terminals described herein. FIGS. 4A and 4B provide cross-sectional views of the novel conductive terminals. FIGS. 5-7 depict the manufacture of such novel conductive terminals. Each of these drawings is now described in turn.

FIG. 1 depicts a side view of a package 100 (e.g., a quad flat no-leads (QFN) package) having conductive terminals in accordance with various examples. In particular, the package 100 comprises a molding 102 (e.g., epoxy) having multiple surfaces, including a bottom surface 112 and a side surface 114. The package 100 may house a semiconductor die mounted on a die pad, for example. The package 100 further includes multiple conductive terminals 104 on each side surface of the package 100 and on the bottom surface of the package 100. The surfaces of the conductive terminals 104 that are exposed to the side surface 114 are labeled with numerals 104A. The package 100 additionally comprises multiple conductive terminals 108 on each side surface of the package 100 and on the bottom surface of the package 100. The surfaces of the conductive terminals 108 that are exposed to the side surface 114 are labeled with numerals 108A. The conductive terminals 108 differ from the conductive terminals 104 in their respective lengths, with the conductive terminals 108 being longer than the conductive terminals 104. In some examples, the conductive terminals 108 are at least 0.500 mm longer than the conductive terminals 104. In some examples, the conductive terminals 108 are between 0.300 mm and 1.0 mm in length, and the conductive terminals 104 are between 0.200 mm and 0.300 mm in length.

Still referring to FIG. 1, the conductive terminals 104 include cavities 106. The portions of the cavities 106 extending along the conductive terminal surfaces 104A are labeled as 106A. Similarly, the conductive terminals 108 include cavities 110. The portions of the cavities 110 extending along the conductive terminal surfaces 108A are labeled as 110A. In some examples, the portions 106A of the cavities 106 extend along at least half of the lengths of their respective conductive terminals 104, and the portions 106A abut the edges (or corners) of their respective conductive terminals 104. In some examples, the portions 110A of the cavities 110 extend along at least half of the lengths of their respective conductive terminals 108, and the portions 110A abut the edges of their respective terminals 108. The cavities 106, 110 permit conductive material (e.g., solder) to flow through the cavities during a reflow process.

FIG. 2 depicts a bottom-up view of the package 100 in accordance with various examples. The package 100 comprises the same conductive terminals 104, 108 and cavities 106, 110 depicted in FIG. 1 and described above. FIG. 2, however, depicts the conductive terminals 104, 108 and the cavities 106, 110 as formed on the bottom surface 112 of the package 100. The surfaces of the conductive terminals 104 that are exposed to the bottom surface 112 are labeled with numerals 104B. The surfaces of the conductive terminals 108 that are exposed to the bottom surface 112 are labeled with numerals 108B. The portions of the cavities 106 extending along the conductive terminal bottom surfaces 104B are labeled as 106B. The portions 106B abut the edges of their respective conductive terminals 104, and the portions 106B extend along at least half of the lengths of their respective conductive terminals 104. The portions 106A, 106B are in fluid communication with each other.

Still referring to FIG. 2, the portions of the cavities 110 extending along the conductive terminal bottom surfaces 108B are labeled as 110B and 110C. The portions 110B of the cavities 110 abut the edges of their respective conductive terminals 108, and the portions 110B extend along at least half of the lengths of their respective conductive terminals 108. In some examples, the lengths of the portions 110A, 110B are the same for each cavity 110. The portions 110C of the cavities 110 are positioned farther from the edges of their respective conductive terminals 108 than their corresponding portions 110B. In some examples, the portions 110C extend along less than half of the lengths of their respective conductive terminals 108. In some examples, the portions 110C are shaped in a circular or semi-circular manner in the plane of the bottom surfaces 108B. In some examples, the portions 110A, 110B, and 110C are in fluid communication with each other. During a reflow process, conductive material (e.g., solder) may flow into the cavities 106, 110 via portions 106B and 110B/110C, respectively, and flow out of the cavities 106, 110 via portions 106A and 110A, respectively. A fillet that forms when conductive material flows out of the portions 106A and/or 110A and onto a PCB may be evaluated using AOI technology, as explained above.

FIG. 3 depicts a perspective view of the package 100 in accordance with various examples. FIG. 3 depicts the package 100 turned upside down, that is, with the bottom surface 112 on top. As explained above, the conductive terminals 104, 108 are exposed to the bottom and side surfaces of the molding 102, and the cavities 106, 110 abut the corners of their respective conductive terminals 104, 108, as shown. When the package 100 is mounted to a PCB (or other surface), conductive material is deposited (e.g., printed) on the PCB at the locations where the conductive terminals 104, 108 of the package 100 are to make electrical contact with the PCB. The bottom surface 112 is then mounted to the PCB and aligned with the conductive material such that the conductive material aligns with the cavities 106, 110 along the bottom surface 112. During a reflow process, the conductive material flows into the cavities 106, 110 via the portions 106B, 110B, and 110C, and out of the cavities via portions 106A and 110A, thereby forming the aforementioned fillets on the surface of the PCB adjacent to the portions 106A and 110A. Because the lengths of the portions 106A, 106B, 110A, and 110B are at least half of the lengths of their corresponding conductive terminals, the fillet visual inspection process described above may be performed properly. In addition, once the reflow process is complete, the reflowed conductive material hardens and forms a connection between each conductive terminal 104, 108 and the corresponding location on the PCB to which that terminal is to be electrically coupled.

FIGS. 4A and 4B depict cross-sectional views of a conductive terminal in accordance with various examples. Specifically, FIG. 4A depicts a cross-sectional view of the conductive terminals 104, 108 along lines 200, 202, respectively (FIG. 2). FIG. 4A shows the conductive terminal surfaces 104A, 108A and bottom surfaces 104B, 108B. The view of FIG. 4A is representative of both of the conductive terminals 104, 108 because along lines 200, 202, the conductive terminals 104, 108 are similar or may be identical, although the scope of this disclosure is not limited as such. Cavities 106, 110 are also depicted. The cavity 106, in some examples, is as deep along the line 200 as the cavity 110 is along line 202. FIG. 4B depicts a cross-sectional view of the conductive terminals 108 along line 204 (FIG. 2). The cavity 110 along line 204 does not extend as deeply into the conductive terminal 108 as does the cavity 110 along line 202, and thus the cavity 110 in FIG. 4A appears to be deeper than the cavity 110 in FIG. 4B. FIG. 4B also depicts the conductive terminal side and bottom surfaces 108A, 108B, respectively.

FIG. 5 depicts a bottom-up view of a portion of a leadframe strip 500, in accordance with various examples. The view shown in FIG. 5 depicts the conductive terminal bottom surfaces 104B, 108B prior to being trimmed and packaged into the package 100. The conductive terminal bottom surfaces 104B, 108B are etched as described below with respect to FIGS. 6A-7 to form the cavities 106, 110. As shown, the photolithography and etching process may be configured as desired to produce any of a variety of cavity shapes, sizes, and configurations, meaning that the scope of this disclosure is not limited to the specific cavity sizes, shapes, and configurations expressly disclosed herein. After cavity formation, the leadframe strip 500 may be sawn along the line 502. Because there is a margin of error with the sawing process, the leadframe strip 500 may actually be sawn anywhere between the margins 504 and 506. Accordingly, the cavities should be formed to account for this margin of error. For example, the portions 110B of cavities 110 may be formed with sufficient depth in the plane of the corresponding conductive terminal bottom surface 108B such that the portions 110B are present in the sawn conductive terminals irrespective of where the leadframe strip 500 is sawn within the margins 504, 506. The specific locations of 504 and 506 depend on the precise manner and dimensions in which the leadframe is manufactured, and these locations may be adjusted as desired (e.g., to facilitate subsequent etching to be deeper, which may occur when, e.g., the area between the locations 504 and 506 is increased).

Figure 6A:
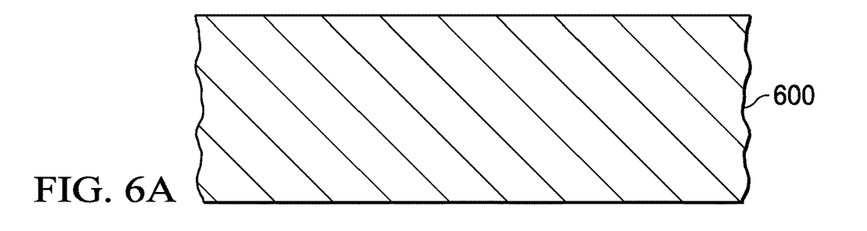
FIGS. 6A-6H depict a process flow for manufacturing a conductive terminal in accordance with various examples.
Figure 6B:
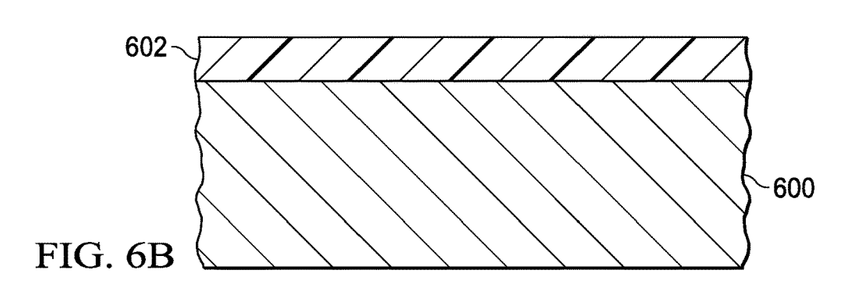
Figure 6C:
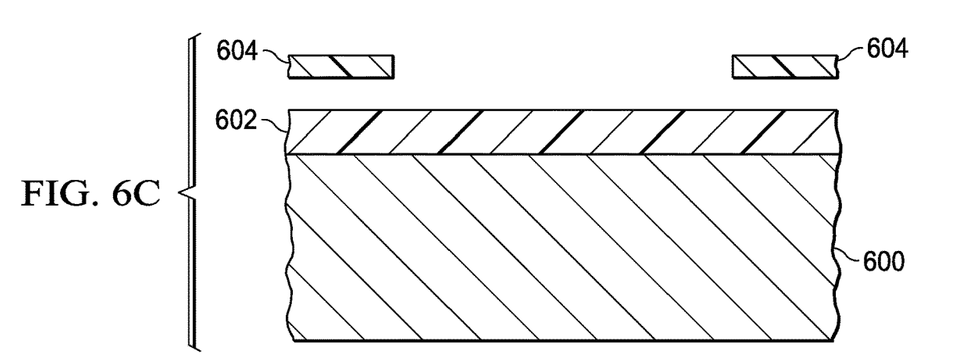
Figure 6D:
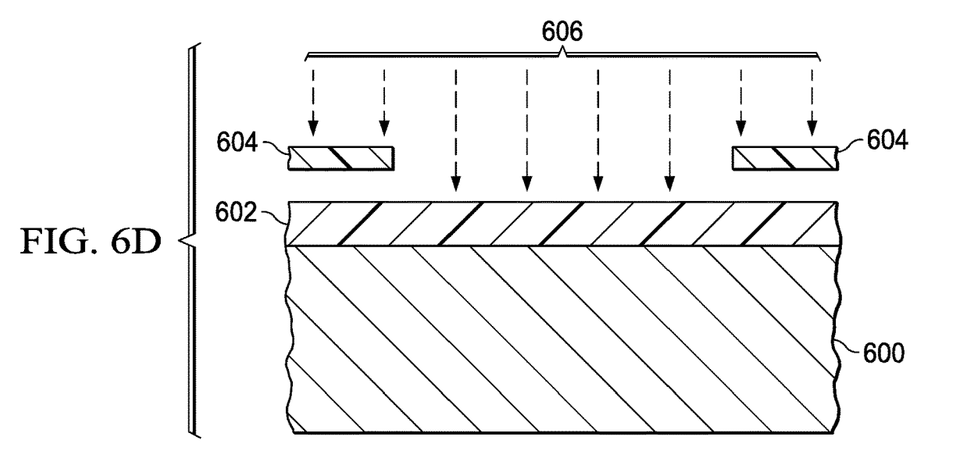
Figure 6E:
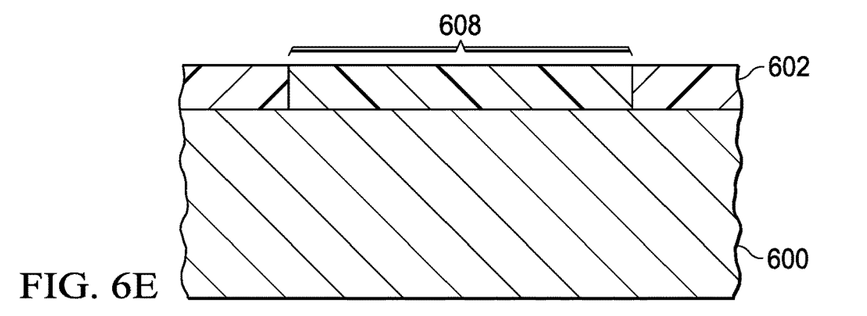
Figure 6F:
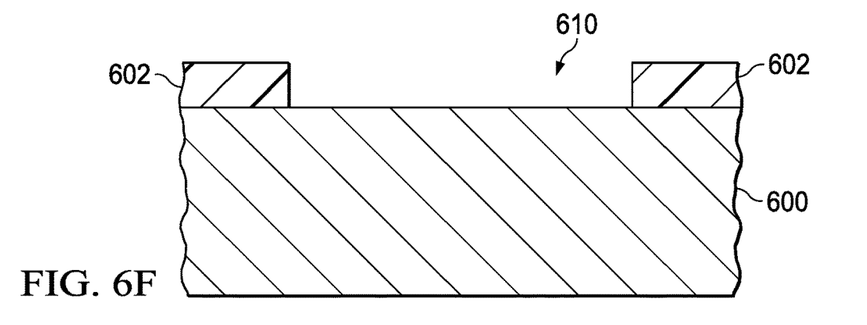
Figure 6G:
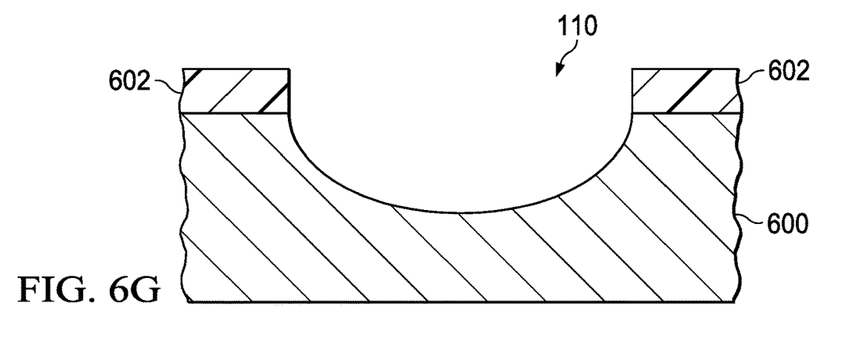

FIGS. 6A-6H depict a process flow for manufacturing a conductive terminal, such as a conductive terminal 108, in accordance with various examples. FIG. 7 depicts a flow diagram of a method 700 for manufacturing a conductive terminal, such as a conductive terminal 108, in accordance with various examples. The photolithography and etching process described with respect to FIGS. 6A-7 is performed on the bottom surfaces 104B, 108B of the conductive terminals. FIGS. 6A-H and 7 are now described in tandem. The method 700 comprises providing a layer of conductive material, such as a conductive material suitable for fabricating a leadframe (e.g., copper) (702). FIG. 6A depicts the provision of a layer of conductive material 600. The method 700 then comprises positioning a photoresist on the layer of conductive material (704). FIG. 6B depicts this step with the addition of a photoresist 602 on the layer of conductive material 600. The method 700 then comprises positioning a mask over the photoresist (706). FIG. 6C depicts this step with the positioning of a mask 604 over the photoresist 602. The mask 604 may be customized so that, upon exposure and development of the photoresist 602 as described below, appropriate areas of the conductive material 600 are exposed for etching the cavities 106 and/or 110. Thus, for example, the mask 604 may be shaped at least partially similar to the portions 110B, 110C of the cavity 110.

The method 700 further comprises exposing the photoresist via the mask and developing the photoresist to produce a pattern on the photoresist (708). FIG. 6D depicts the application of light 606 to the photoresist 602 via the mask 604, rendering the areas 608 soluble to a developer, as FIG. 6E depicts. FIG. 6F depicts the development of the photoresist 602, and more specifically the area 608, so that the area 608 is removed according to the pattern of the mask 604, as numeral 610 depicts. The method 700 subsequently comprises etching the layer of conductive material using the pattern to produce an orifice having a first portion extending along at least half of a first surface of the layer of conductive material and a second portion extending along less than half of the first surface of the layer of conductive material, the first and second portions in fluid communication with each other (710). FIG. 6G depicts this etching of a cavity into the layer of conductive material 600 using any suitable etchant, such as a chemical etchant suitable for etching copper. Numeral 110 depicts an etched cavity 110. Similar techniques may be used to etch cavities 106.

Figure 6H:
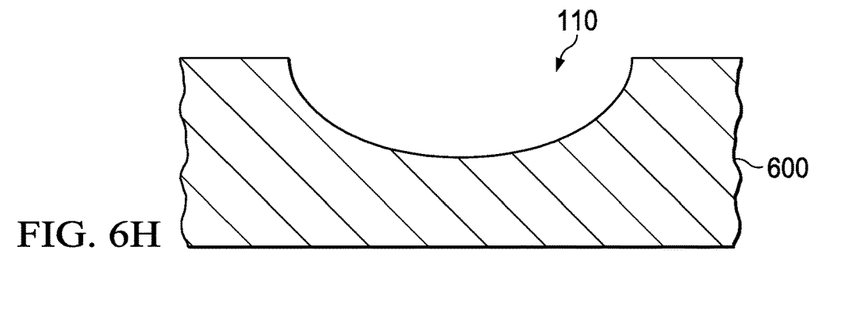
Figure 7:
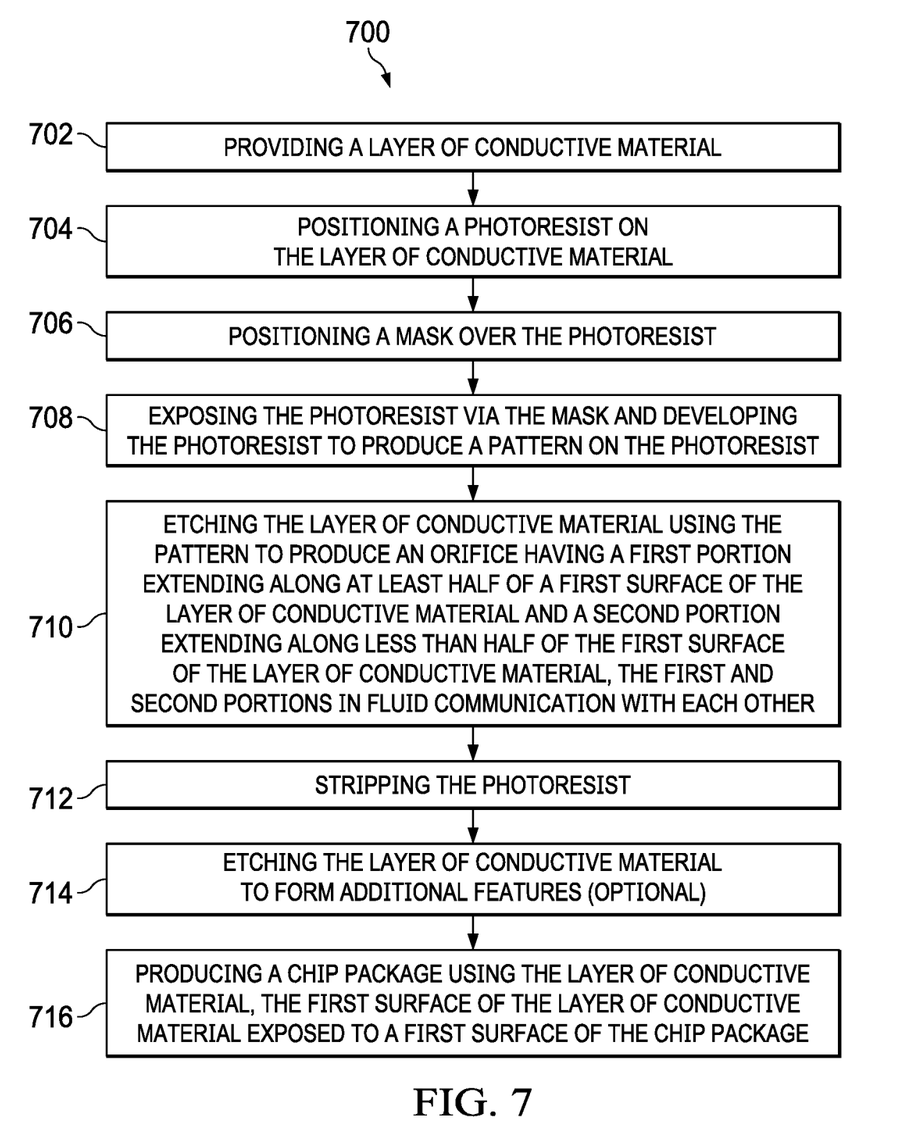
FIG. 7 depicts a flow diagram of a method for manufacturing a conductive terminal in accordance with various examples.

The method 700 next includes stripping the photoresist (712), as FIG. 6H depicts with the removal of photoresist 602. The method 700 optionally comprises etching the layer of conductive material to form additional features, as desired. Any of a variety of additional features may be etched into the layer of conductive material 600 using one or more additional rounds of etching. In some examples, multiple rounds of etching may be used to etch the cavity 110. For example, a mask may be specifically designed to etch only partially during a first round of etching, and another mask may be used in a second round of etching to form the features shown in, e.g., FIGS. 1 and 2. The method 700 still further comprises optionally plating the layer of conductive material with, e.g., nickel palladium gold or another suitable plating alloy. The method 700 further comprises producing a chip package using the layer of conductive material, the first surface of the layer of conductive material exposed to a first surface of the chip package (716). For example, the etched conductive material may be incorporated into a chip package as a conductive terminal that is usable to transfer electrical signals to and from a semiconductor die housed inside the chip package.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:
1. A package comprising:
   a molding; and a conductive terminal in contact with the molding and having a first surface exposed to a first surface of the molding, the conductive terminal including a cavity having a first portion extending along at least half of the first surface of the conductive terminal and a second portion extending along less than half of the first surface of the conductive terminal, wherein the second portion has a semi-circular shape in a plane of the first surface.

2. The package of claim 1, wherein the first and second portions are in fluid communication with each other.

3. The package of claim 1, wherein the cavity is exposed to a corner of the conductive terminal at which the first surface of the conductive terminal meets a second surface of the conductive terminal.

4. The package of claim 3, wherein the cavity extends along at least half of a length of the second surface of the conductive terminal.

5. The package of claim 3, wherein the second portion is positioned farther away from the corner than the first portion.

6. The package of claim 1, further comprising another conductive terminal, the conductive terminal having a greater length than the another conductive terminal.

7. The package of claim 1, wherein the package comprises a quad flat no-leads (QFN) package.

8. The package of claim 1, wherein at least a portion of the conductive terminal includes a nickel palladium gold plating.

9. A package comprising:
a molding; and
a conductive terminal in contact with the molding, a first surface of the conductive terminal exposed to a first surface of the molding and a second surface of the conductive terminal exposed to a second surface of the molding, the conductive terminal including a cavity exposed to the first and second surfaces of the conductive terminal,
wherein the cavity includes first and second portions on the first surface of the conductive terminal, the first portion extending along at least half of a length of the first surface of the conductive terminal, the second portion extending along less than half of the length of the first surface of the conductive terminal, wherein the second portion has a semi-circular shape in a plane of the first surface, and
wherein the cavity extends along at least half of a length of the first surface of the conductive terminal.

10. The package of claim 9, wherein the cavity is exposed to a corner of the conductive terminal at which the first and second surfaces meet.

11. The package of claim 10, wherein the second portion is farther from the corner than the first portion.

12. The package of claim 9, wherein the package comprises a quad flat no-leads (QFN) package.

13. The package of claim 9, wherein the first and second portions are in fluid communication with each other.

14. The package of claim 9, wherein the conductive terminal includes nickel palladium gold plating.

15. A package comprising:
a molding; and
a first conductive terminal and a second conductive terminal in contact with the molding; wherein the first conductive terminal includes a first surface exposed to a first surface of the molding, the first conductive terminal including a first cavity with a first portion extending along at least half of the first surface of the first conductive terminal and a second portion extending along less than half of the first surface of the first conductive terminal; and
wherein the second conductive terminal includes a first surface exposed to the first surface of the molding, the second conductive terminal including a second cavity with a first portion extending along less than half of the first surface of the second conductive terminal.

16. The package of claim 15, wherein the first and second portions the first conductive terminal are in fluid communication with each other.

17. The package of claim 15, wherein the first surface of the first conductive terminal is larger in area than the first surface of the second conductive terminal.

18. The package of claim 15, wherein the first cavity and the second cavity are exposed to a corner of each of the first conductive terminal and the second first conductive terminal, wherein the corner is located where the first surface of each of the first conductive terminal and the second conductive terminal meets a second surface of each of the first conductive terminal and the second conductive terminal respectively.

* * * * *